United States Patent
Satoh et al.

(10) Patent No.: US 8,883,520 B2
(45) Date of Patent: Nov. 11, 2014

(54) REDEPOSITION CONTROL IN MRAM FABRICATION PROCESS

(75) Inventors: Kimihiro Satoh, Beaverton, OR (US); Dong Ha Jung, Pleasanton, CA (US); Ebrahim Abedifard, Sunnyvale, CA (US); Parviz Keshtbod, Los Altos Hills, CA (US); Yiming Huai, Pleasanton, CA (US); Jing Zhang, Los Altos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 232 days.

(21) Appl. No.: 13/530,381

(22) Filed: Jun. 22, 2012

(65) Prior Publication Data

US 2013/0341801 A1   Dec. 26, 2013

(51) Int. Cl.
   *H01L 21/00*   (2006.01)

(52) U.S. Cl.
   USPC   438/3; 257/421; 257/E21.665; 257/E21.585; 365/158

(58) Field of Classification Search
   CPC ........ H01L 43/00; H01L 43/08; H01L 27/222
   USPC ...................... 438/3; 257/295, 421, E21.665, 257/E21.585; 365/158
   See application file for complete search history.

(56) References Cited

U.S. PATENT DOCUMENTS

| | | | |
|---|---|---|---|
| 7,144,744 B2 * | 12/2006 | Lien et al. | ......................... 438/3 |
| 7,897,950 B2 | 3/2011 | Shoji | |
| 7,898,007 B2 | 3/2011 | Lee et al. | |
| 7,906,347 B2 | 3/2011 | Sato | |
| 7,919,794 B2 | 4/2011 | Gu et al. | |
| 7,919,826 B2 | 4/2011 | Iwayama et al. | |
| 7,936,027 B2 | 5/2011 | Xiao et al. | |
| 7,955,870 B2 | 6/2011 | Ditizio | |
| 7,985,667 B2 | 7/2011 | Cho | |
| 7,989,224 B2 | 8/2011 | Gaidis | |
| 2004/0063223 A1 | 4/2004 | Costrini et al. | |
| 2010/0181654 A1 | 7/2010 | Fujiwara et al. | |

* cited by examiner

*Primary Examiner* — David Vu
(74) *Attorney, Agent, or Firm* — G. Marlin Knight; Bing K. Yen

(57) ABSTRACT

Methods and structures are described to reduce metallic redeposition material in the memory cells, such as MTJ cells, during pillar etching. One embodiment forms metal studs on top of the landing pads in a dielectric layer that otherwise covers the exposed metal surfaces on the wafer. Another embodiment patterns the MTJ and bottom electrode separately. The bottom electrode mask then covers metal under the bottom electrode. Another embodiment divides the pillar etching process into two phases. The first phase etches down to the lower magnetic layer, then the sidewalls of the barrier layer are covered with a dielectric material which is then vertically etched. The second phase of the etching then patterns the remaining layers. Another embodiment uses a hard mask above the top electrode to etch the MTJ pillar until near the end point of the bottom electrode, deposits a dielectric, then vertically etches the remaining bottom electrode.

4 Claims, 12 Drawing Sheets

REDEPOSITION CONTROL IN MRAM FABRICATION PROCESS

FIELD OF THE INVENTION

The present invention relates generally to semiconductor Back-End-Of-Line (BEOL) memories and particularly to Magnetic Random Access Memory (MRAM) and particularly to techniques and structures for preventing metallic redeposition on sidewalls of the memory element during fabrication.

BACKGROUND

The BEOL memories such as RRAM (Resistive Random Access Memory), PRAM (Phase Change Random Access Memory), and MRAM have a resistive device as a memory element. Because high speed access and non-volatility at power off are promised by these devices, they may replace existing memories and create new markets.

FIG. 1B illustrates a typical in-process MTJ memory device 19 at a selected stage during the fabrication process where redeposition material 110 is coating the patterned pillar. The memory device 19, which includes a top electrode 17, a bottom electrode 13 and the magnetic tunnel junction (MTJ) memory element between the electrodes, is fabricated in a pillar shape using conventional lithography and dry etching process. The MTJ memory element typically includes a pinned magnetic layer and a free magnetic layer with a barrier layer 15 in between. In the figure the terms upper magnetic layer 16 and lower magnetic layer 14 are used because either one can be the pinned layer and the other one will be the free layer. The lower magnetic layer 14 is deposited first and will also be called the first magnetic layer. The MTJ layers and bottom electrode are etched conventionally with ion milling or high biased reactive ion etching where elements are mainly removed mechanically. Mechanically etched material is easily redeposited and the redeposited metal is electrically conductive. The redeposition layer 110 forms on MTJ sidewall especially on the barrier layer. The pinned layer and the free layer can be electrically shorted by the redeposition layer 110, which makes the device inoperable.

The source of the redeposition material can be the MTJ stack itself or previously deposited metal layers under the MTJ stack. Once the etching process that forms the pillars passes through the barrier layer, the exposed sidewall of the barrier layer becomes susceptible to being shorted with the redeposited metal. After the bottom electrode layer is etched away, previously deposited metal in the MTJ landing pad and peripheral circuits is exposed to the etching ambient and can be sputtered out and redeposited on the sidewall.

SUMMARY OF THE INVENTION

Embodiments of the invention include methods and structures to reduce metallic redeposition material in memory cells, such as MTJ cells, during pillar etching and thereby reduce or eliminate redeposition material on the MTJ barrier layer sidewall. A first embodiment forms metal studs on top of the MTJ landing pads in a dielectric layer that otherwise covers the exposed metal surfaces on the wafer to prevent exposing the metal to the MTJ etching ambient. The metal studs provide the electrical connection between the bottom electrodes and the landing pads. An optional process for this embodiment adds a touch-up metal layer and a light CMP to ensure a smooth surface for patterning the pillars.

The second embodiment patterns the MTJ and bottom electrode separately. The bottom electrode mask then covers metal under the bottom electrode. In this embodiment the MTJ mask can be patterned before or after the bottom electrode mask. The embodiment where the bottom electrode is defined prior to the MTJ includes depositing a dielectric layer used to stop bottom electrode etching to prevent building a deep step structure at the edge of the bottom electrode. This avoids the problem of the MTJ stack deposited on sidewall of the deep step being difficult to clean away.

The third embodiment divides the etching process of the MTJ pillars into two phases. The first phase etches through the barrier layer down to the lower magnetic layer. The exposed sidewalls, which include the barrier layer sidewalls, are covered with a dielectric material formed by deposition then vertical etching. The second phase of the etching then patterns the lower magnetic layer and bottom electrode. The sidewall of the barrier layer is thereby protected from shorting redeposition metal during phase two etching.

The fourth embodiment uses a hard mask above the top electrode in the layer stack. The method etches the MTJ pillar until near the end point of the bottom electrode, leaving a thin layer of the bottom electrode covering horizontal surfaces. A dielectric material is deposited, then vertically etched to leave a sleeve of dielectric material around most of the pillar. The vertical etching also removes the remaining bottom electrode. The sleeve of dielectric material protects the barrier layer from redeposition when metallic surfaces under the bottom electrode are exposed. The hard mask protects the top electrode in the MTJ pillar from excessive etching during this process.

BRIEF DESCRIPTION OF THE FIGURES

FIG. 3A illustrates an irregular (non-flat) surface topology problem that can occur when a conventional CMP process is used. FIG. 3B illustrates the result of the optional process steps embodiment that includes depositing touch-up metal 213 followed with a light CMP.

DETAILED DESCRIPTION OF THE INVENTION

In the following description of the embodiments, reference is made to the accompanying drawings that form a part hereof, and in which is shown by way of illustration of specific embodiments in which the invention may be practiced. It is to be understood that other embodiments may be utilized without departing from the scope of the present invention. It should be noted that the figures discussed herein are not drawn to scale and thicknesses of lines are not indicative of actual sizes. Some standard interconnection features are illustrated symbolically. The cross section view in the figures is generally taken through the approximate center the memory cell in a plane perpendicular to the wafer surface except where otherwise noted. Although only a few cell are shown in the figures, the method may used for the simultaneous fabrication of many cells in arrays on a wafer according to standard techniques. A plurality of arrays with associated circuitry can be made on a single wafer which can then be cut into smaller pieces (chips) for further processing into final operational devices.

Figure 1A:
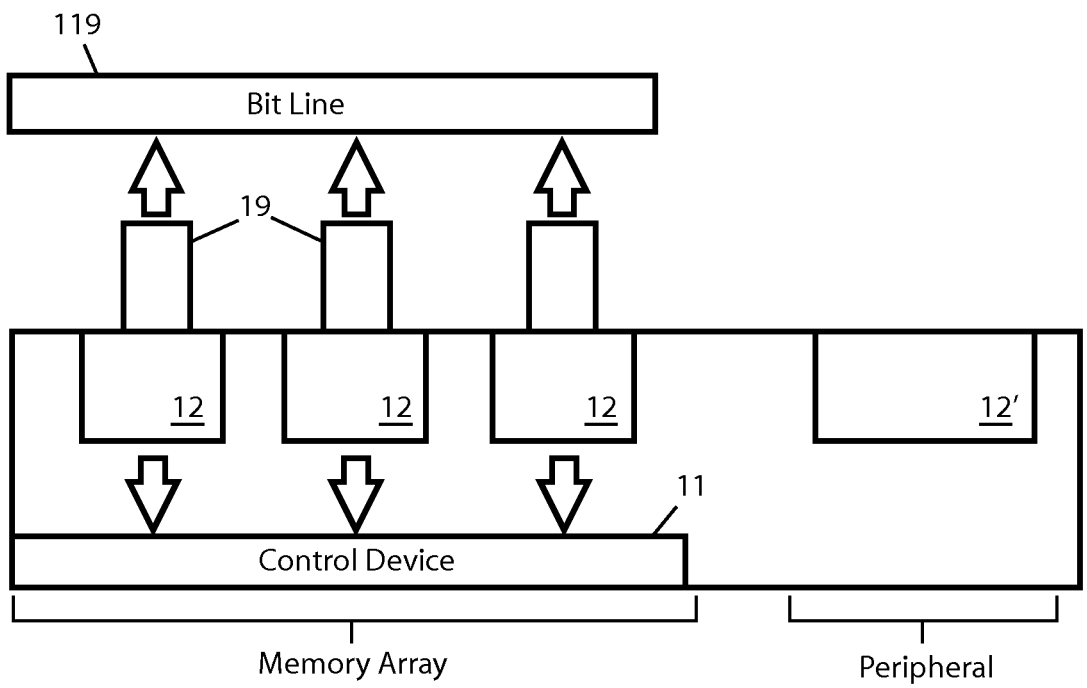
FIG. 1A illustrates a cross sectional view of thin films on a wafer at a selected stage of a prior art fabrication process for MTJ MRAM. Some standard interconnection features are illustrated symbolically.
Figure 1B:
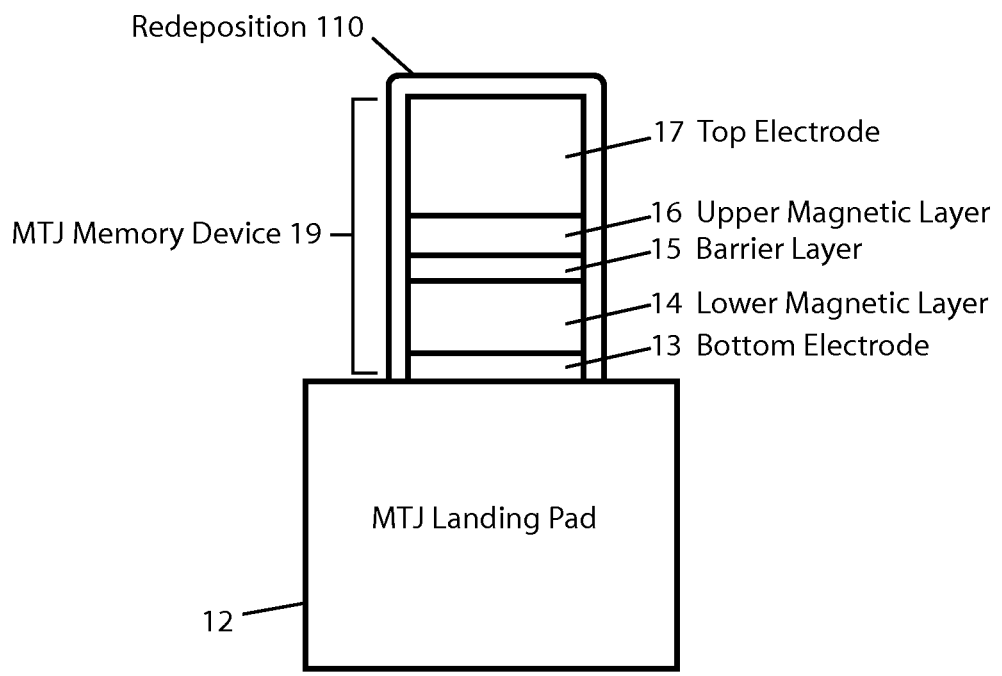
FIG. 1B illustrates a detailed cross sectional view of thin films in an MTJ pillar on a wafer at a selected stage of a prior art fabrication process for MTJ MRAM.

FIGS. 1A and 1B illustrate cross sectional views of thin films at a selected stage of a conventional MTJ MRAM process. A memory element 19 pillar sits on a landing pad 12. One of the magnetic layers is pinned layer with a fixed magnetic field and other is a free layer whose magnetic orientation is manipulated by electrical current. As shown in FIG. 1A the landing pad 12 is connected a control device 11 such as a FET and a diode as symbolically indicated by arrows. The memory elements 19 are interconnected to a bit line 119 as symbolically indicated by arrows. The same metal layer used for the landing pad 12 is utilized for logic circuit pad 12' in the peripheral area.

Metallic redeposition 110 on sidewall of the memory element during MTJ etching is a serious issue because it can short the pair of magnetic layers. The source of the redeposition metal can be from the landing pad 12, the peripheral circuit 12' and/or layers of the memory element itself.

First Embodiment

Figure 2:
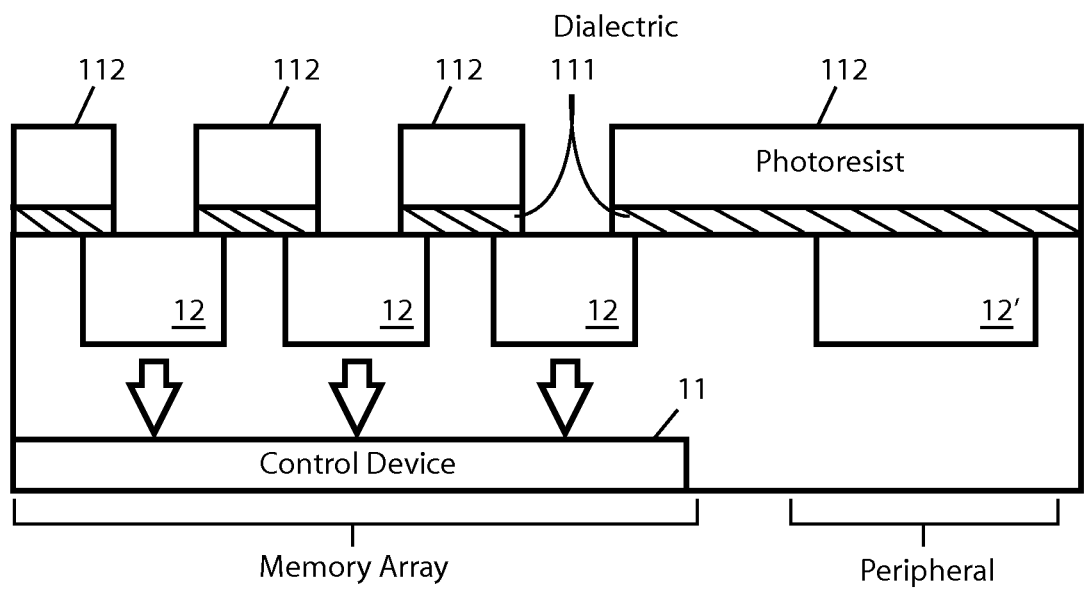
FIG. 2 illustrates a cross sectional view of a selected process stage for the first embodiment of the invention after the dielectric layer 111 has been deposited and patterned.

FIG. 2-FIG. 5 illustrate cross sectional views of selected process stages for the first embodiment which minimizing exposure of landing pad metal by MTJ over-etching. As shown in FIG. 2, after the landing pad patterning process has been completed, a dielectric layer 111 is first deposited over the wafer on the exposed landing pads 12, 12'. Next using a conventional lithography process, photoresist mask 112 has been deposited and patterned as shown to allow the dielectric material to be dry etched away from the center area of the tops of the landing pads 12 while peripheral landing pad 12' remain protected. The photoresist mask 112 covers the peripheral area metal during this etching. The gaps in the mask over the landing pads are smaller in horizontal area than the upper surface of the landing pad. This allows dielectric material to remain on the outer edges of the landing pads 12 after etching, but central vias have been formed exposing a portion of the upper surface of the landing pads 12. After stripping the photoresist, the vias are then filled with metal by depositing a layer, for example, of copper or tungsten to form metal studs 113 in electrical contact with the underlying landing pad. A planarizing CMP (Chemical Mechanical Polish) process follows to planarize and prepare the surface with the metal studs 113 as shown FIG. 3. The surface area of metal studs 113 is less than the surface area of the landing pad and no metal is exposed in peripheral areas at this stage. From the state shown in FIG. 3 the standard process of fabricating the pillars for MTJ memory devices 19 can be resumed.

Figure 3:
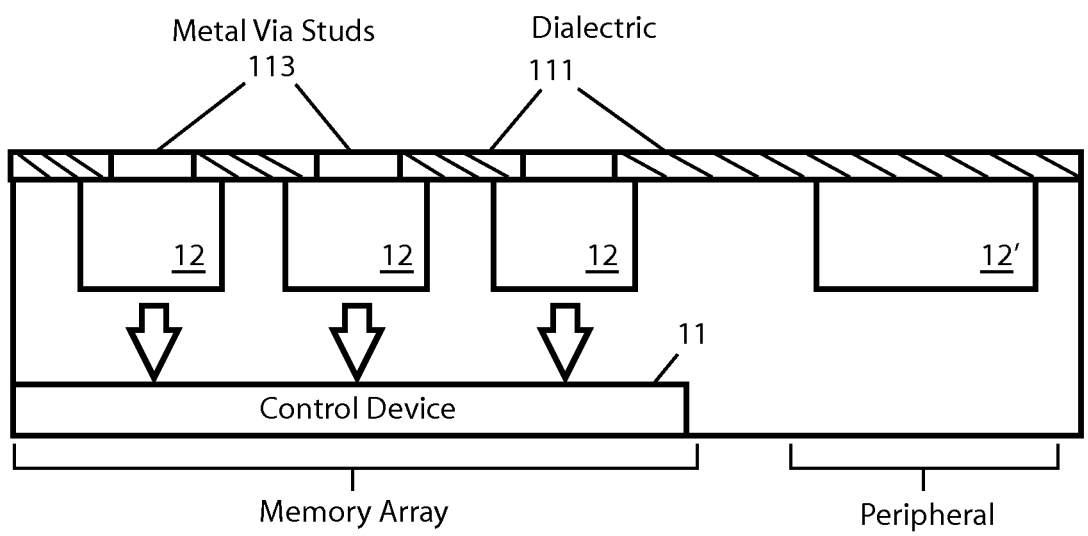
FIG. 3 illustrates a cross sectional view of a selected process stage for the first embodiment of the invention subsequent to that of FIG. 2, after the metal for studs 113 has been deposited and a CMP process has been applied to planarize the surface.
Figure 3A:
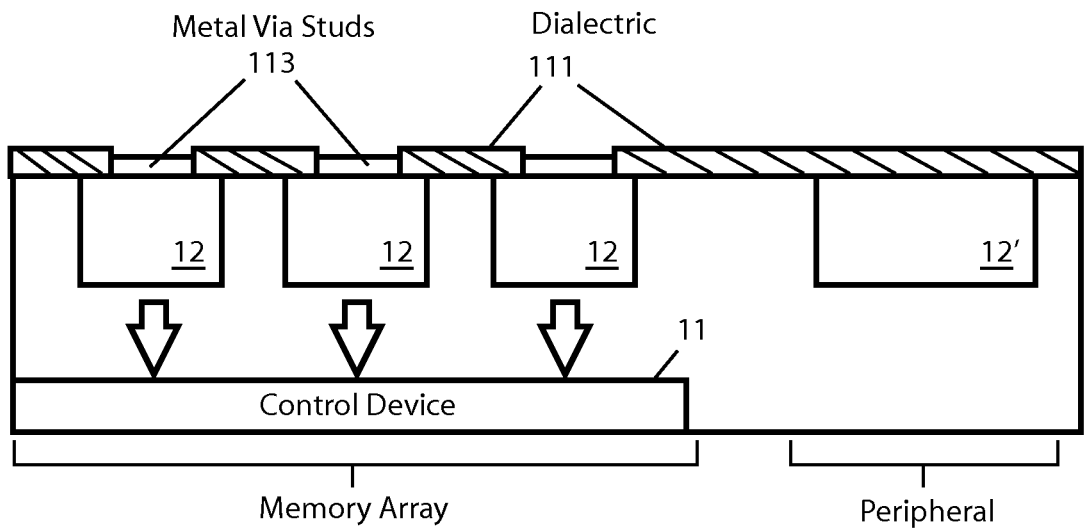
FIG. 3A and FIG. 3B illustrate cross sectional views of selected process stages in an optional alternative of the first embodiment that included process steps performed after the stage shown in FIG. 3.
Figure 3B:
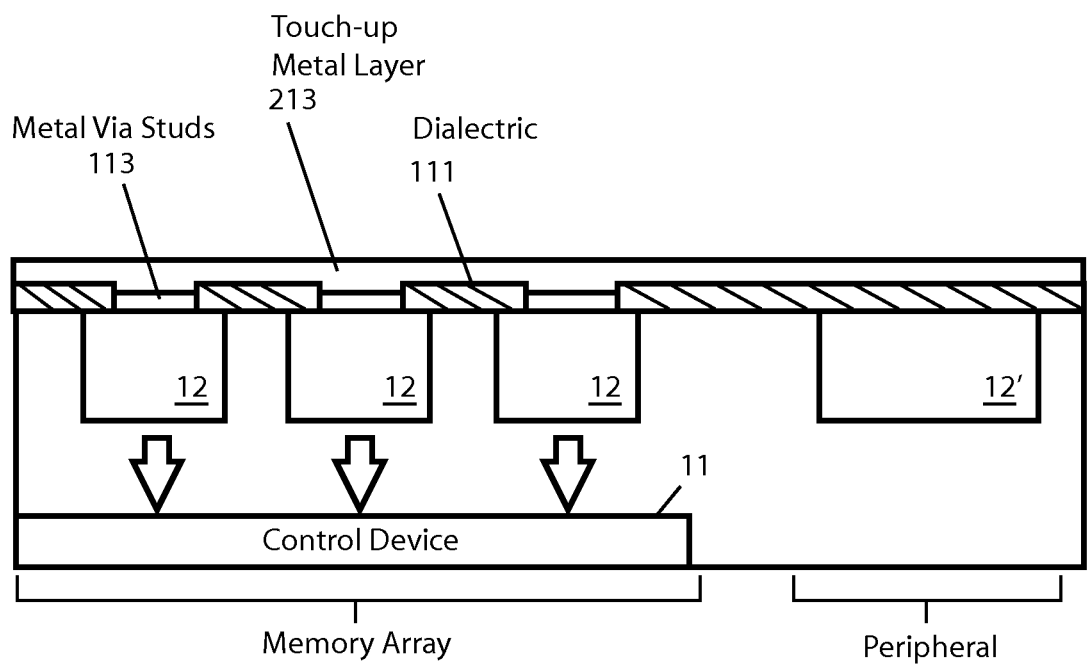

FIG. 3A and FIG. 3B illustrate cross sectional views of selected process stages in an optional alternative of the first embodiment that includes process steps performed after the stage shown in FIG. 3. FIG. 3A illustrates an irregular (non-flat) surface topology problem that can occur when a conventional CMP process is used on a surface containing pads of different materials that are abraded at different rates. An irregular surface is undesirable for magnetic memory elements. Therefore, an alternative embodiment includes depositing a layer that serves as touch-up metal 213 as shown in FIG. 3B. A light CMP is applied to this surface to provide a flatter surface plane. The layer 213 is patterned when the bottom electrode is etched as later described. With this optional process, the final metal studs can include two layers of metal. For example, the initial metal layer 113 can be copper and the touch-up metal can be tungsten. Other metals can be used as well.

Figure 4:
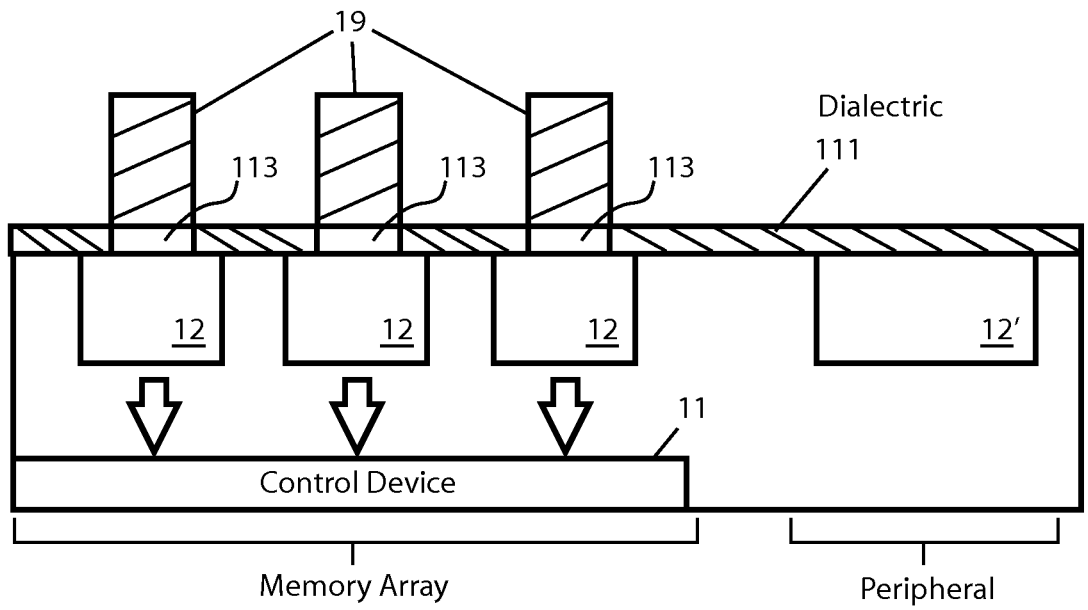
FIG. 4 illustrates cross sectional view of a selected process stage for the first embodiment of the invention subsequent to that of FIG. 3, after the pillars for the MTJ devices have been formed on metal studs 113.
Figure 5:
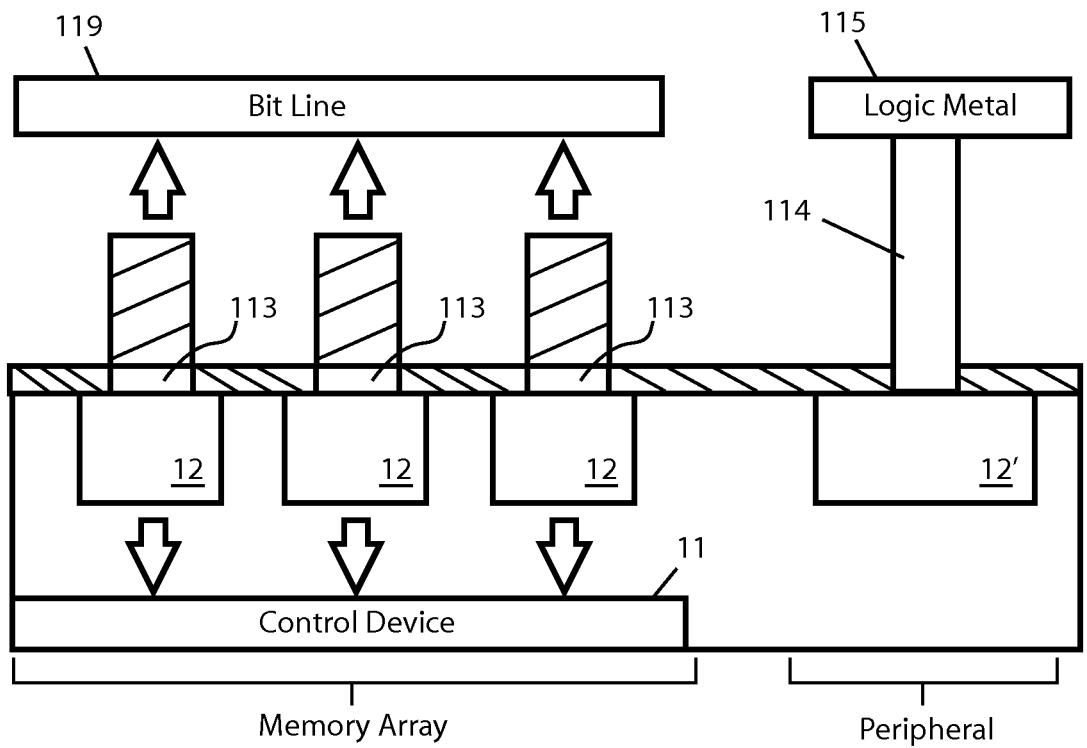
FIG. 5 illustrates a cross sectional view of the resulting structures for the first embodiment of the invention after the interconnection process.

As shown in FIG. 4 the pillars for MTJ memory devices 19 are patterned directly on top of the metal studs 113 which provide the electrical connection to landing pads 12. The studs 113 are embedded in the dielectric material 111 according to this embodiment of the invention to minimize metal exposure during the memory element etching. The interconnect process is completed as shown in FIG. 5. The peripherals are connected to logic metal 115 through separately patterned via 114.

Figure 5A:
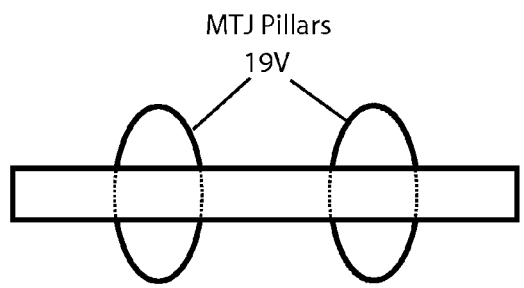
FIGS. 5A and 5B illustrate alternative layout orientations of the memory element pillars in top plan views for the first embodiment of the invention.
Figure 5B:
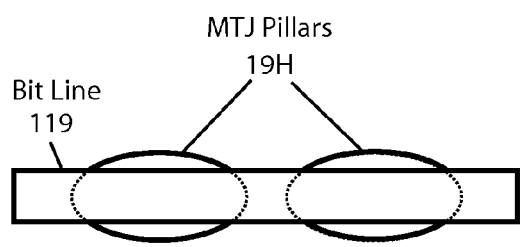
Figure 5C:
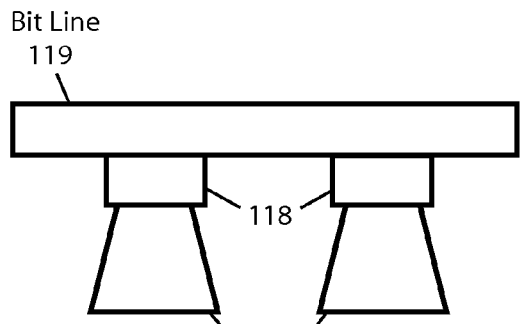
FIG. 5C illustrate long via contact alternative embodiment in cross section view and top plan view is illustrated in FIG. 5D for the first embodiment of the invention.
Figure 5D:
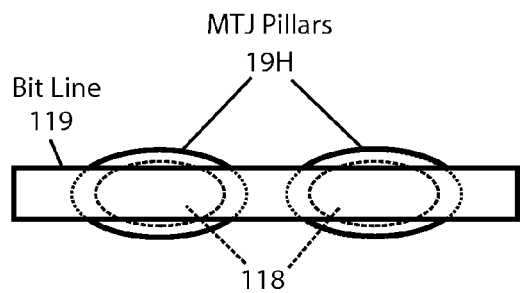

In a top plan view the MTJ pillars are generally oval-shaped but other shapes can be used including circles. There are two ways to place MTJ pillar as shown FIGS. 5A and 5B which are top plan views. FIG. 5A illustrates an orientation of MTJ pillar 19V where the long axis is perpendicular to the bit line 119. In FIG. 5B, illustrates an orientation with the long axis of MTJ pillars 19H parallel to the direction of the bit line 119. In this orientation a long via 118, which is also oval-shaped may replace the standard circle contact to get more overlay margin as shown in cross section view in FIG. 5C and top plan view in FIG. 5D.

Second Embodiment

The second embodiment patterns the MTJ and bottom electrode separately. An etch-stop layer is deposited on the ILD before the landing pads are formed by the damascene process. In this embodiment the MTJ mask can optionally be patterned before or after the bottom electrode mask. In one alternative the bottom electrode mask covers metal under the bottom electrode. The embodiment where the bottom electrode is defined prior to MTJ, the etch-stop layer stops bottom electrode etching to prevent building a deep step structure at the edge of the bottom electrode. This avoids the problem of the MTJ stack deposited on sidewall of the deep step being difficult to clean away.

FIG. 6-FIG. 11 illustrate cross sectional views of selected process stages for the second embodiment which cover the landing pads 12 and peripheral pad 12' with an additional bottom electrode mask that is separate from an MTJ mask.

Figure 6:
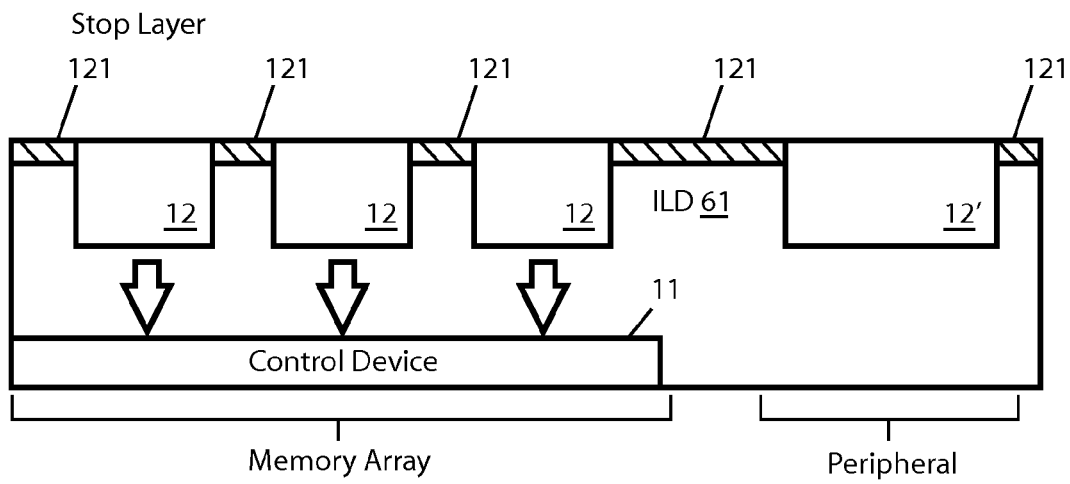
FIG. 6-FIG. 10 illustrate cross sectional views of selected process stages for the second embodiment of the invention.

Etch-stop layer structures 121 for the bottom electrode etching are patterned on a surface of interlayer dielectric (ILD) layer 61 as shown in FIG. 6. The surfaces of the landing pads 12 are left exposed. The material for the etch-stop structures is selected so that the etching ambient used for the bottom electrode etches the bottom electrode material faster than the etch-stop structures. Aluminum oxide, magnesium oxide borazinic film is preferred for the stop layer. Each of these materials has good selectivity in the bottom electrode etching ambient.

To form the etch-stop layer structures 121, the stop layer material is deposited over the ILD 6 before the landing pads are formed. A trench is then formed in the stop layer 121 and the ILD. The trench is plugged with copper or tungsten using conventional Damascene process to form the landing pads 12, 12'. The bottom electrode layer is deposited over the wafer structure in FIG. 6.

Figure 7:
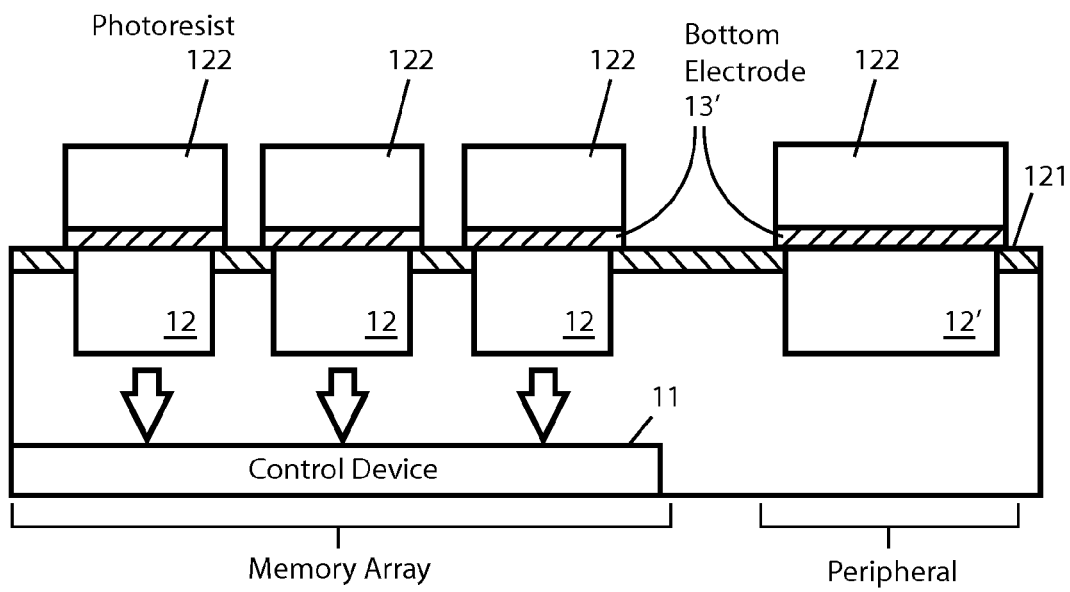

Using conventional lithography photoresist mask 122 is patterned to cover the landing pads 12 and peripheral metal 12', followed by conventional dry etching to form a bottom electrode pads 13' for each device as shown in FIG. 7, where layer 121 works as an etch-stop layer to prevent building deep step at edge of the bottom electrode 13'.

Figure 8:
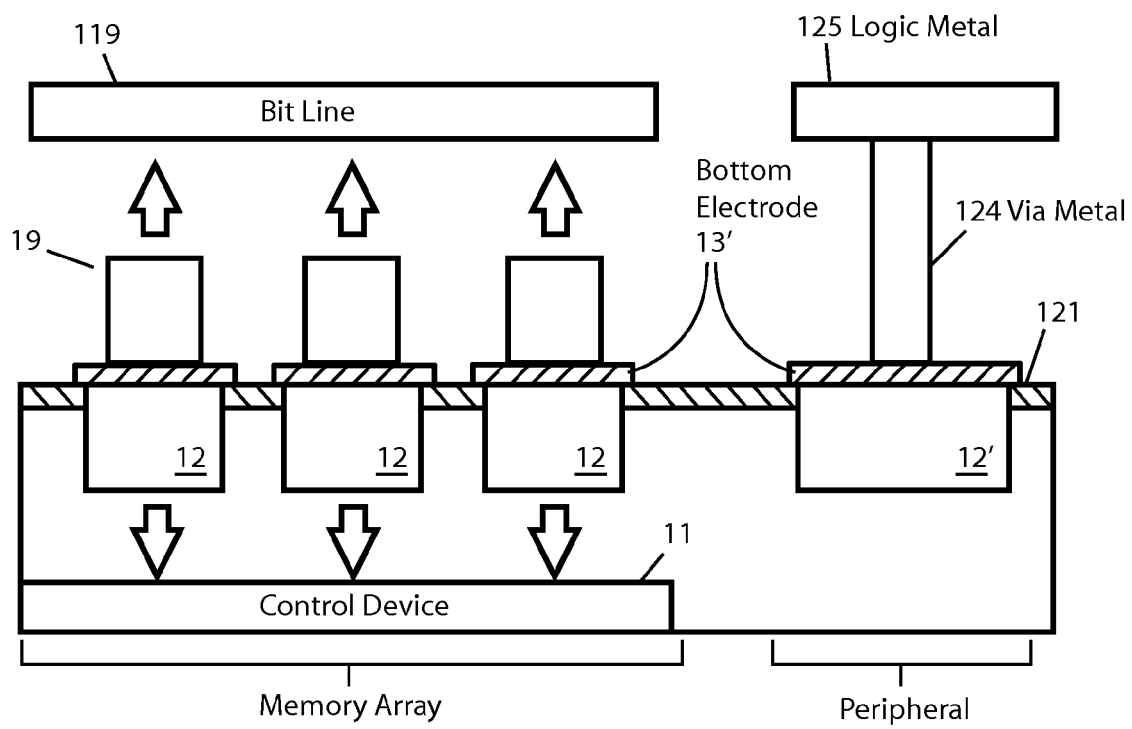

From the stage shown in FIG. 7, the photoresist 122 is stripped, then the rest of the layers for the MTJ device are deposited and patterned by using conventional lithography and dry etching. However, unlike the prior art process, the metal in landing pads 12, 12' is covered with the bottom electrode pads formed according to this embodiment of the invention. After the MTJ pillars have been completed, the interconnect process is completed as shown in FIG. 8. A filled via hole 124 connecting to upper logic metal 125 is individually patterned for peripheral pad 12'.

Figure 9:
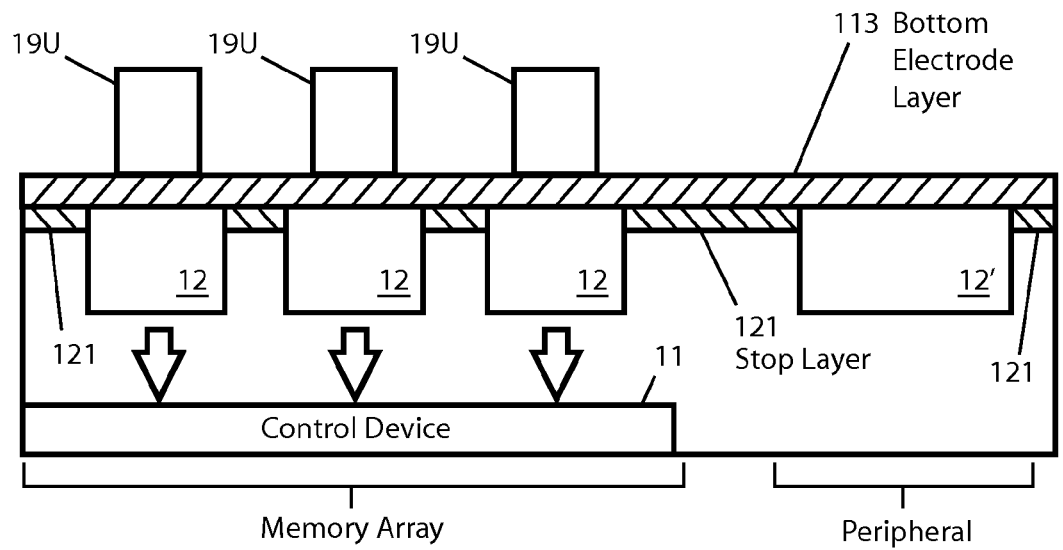
Figure 10:
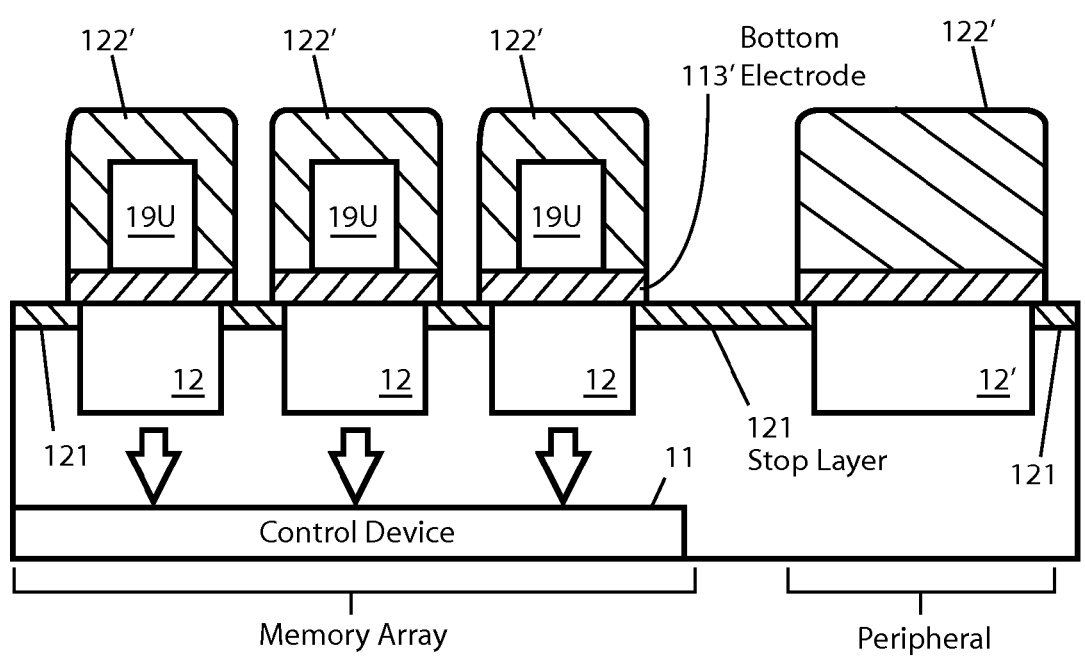

In an alternative of this second embodiment, the sequence of the MTJ mask and the bottom electrode mask are switched as shown in FIG. 9 and FIG. 10. The etch-stop layer 121 is formed as described above. To reach the stage shown in FIG. 9, all of the layers for the MTJ device are deposited over the wafer in sequence and then patterned by using conventional lithography and dry etching as shown. However, etching is stopped in the bottom electrode layer 113, so that it remains as a continuous film over the exposed surfaces outside of the pillars. This leaves the upper portion of the pillars 19U etched into their pillar shape, but the bottom electrode layer 113 has not yet been patterned. Either CH3OH or CO/NH3 is generally used in MTJ etching, where bottom electrode has higher selectivity than ten (10) so that the etching is easily stopped in the bottom electrode layer.

FIG. 10 illustrates a subsequent stage after FIG. 9. Photoresist 122' has been deposited and patterned as shown around the upper layer pillars 19U which provides protection for a pad 113' of the bottom electrode layer 113 under each pillar 19U. The bottom electrode pads 113' extend beyond the edges of the upper pillars 19U on all sides. In addition a photoresist pad has been patterned over the peripheral pad 12'. The bottom electrode layer 113 material that is exposed between the photoresist pads 122' is then etched and the etch-stop layer 121 provides the stopping point. After the photoresist pads 122' are stripped the pillars for the MTJ memory device are ready for the interconnection process. The cross section of the thin film after the interconnect process are illustrated FIG. 8. As illustrated filled via hole 124 connects peripheral pad 12' to upper logic metal 125.

Third Embodiment

Figure 11:
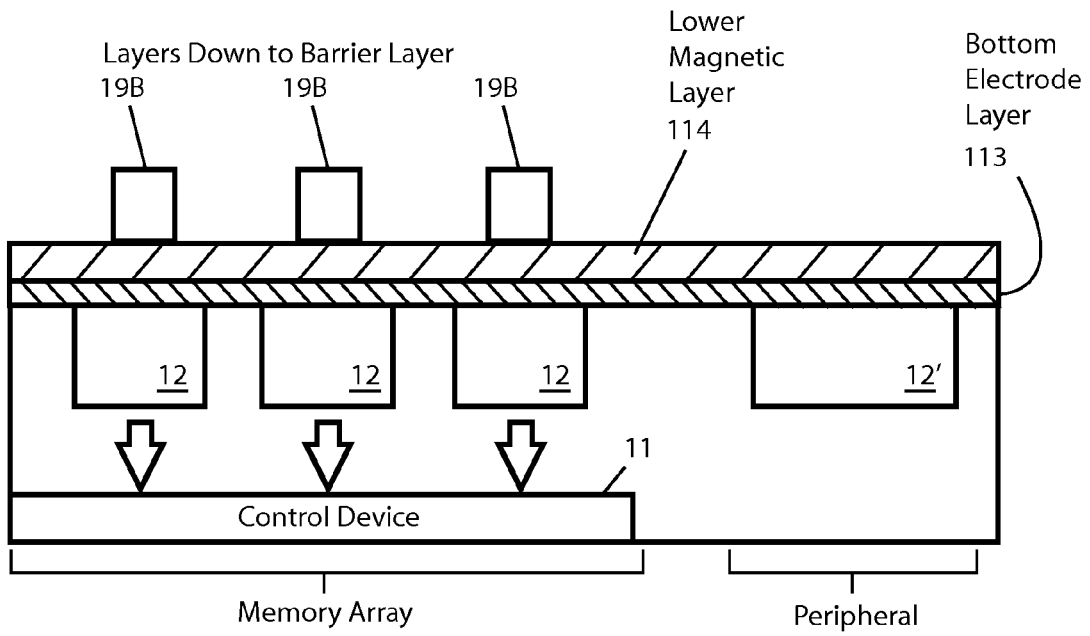
FIG. 11-FIG. 14 illustrate cross sectional views of selected process stages for the third embodiment of the invention.

FIG. 11-FIG. 14 illustrate cross sectional views of selected process stages for the third embodiment. The set of layers for the MTJ device, including a hard mask above the top electrode, is first deposited in sequence. Each of these layers including the hard mask can be standard materials. The photoresist (not shown) for the pillars is patterned by using conventional lithography and then dry etching proceeds to achieve the stage as shown in FIG. 11, where the etching process has been stopped as soon the barrier layer has been etched through or optionally at any point in the barrier layer. At this stage partially formed pillars 19B include the barrier layer and all layers above it. The layers for the lower magnetic layer 114 and the bottom electrode 113 are still continuous full films. The top layer of pillars 19B is the hard mask (not shown).

Figure 12:
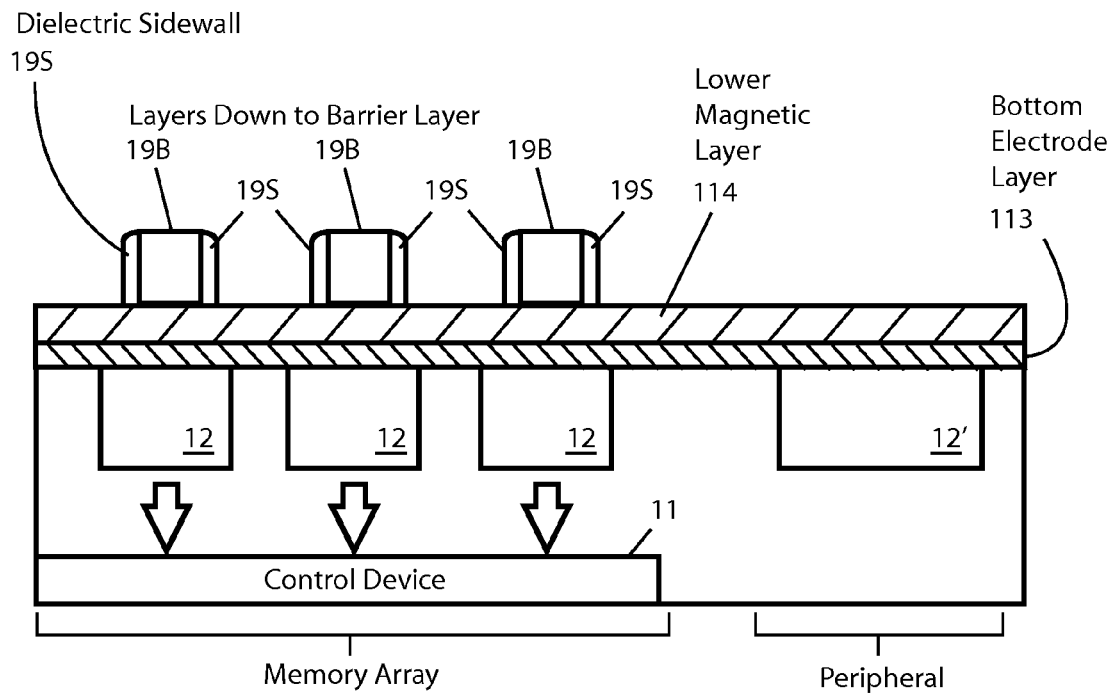

A subsequent stage is illustrated in FIG. 12 after an oxygen free dielectric material has deposited without breaking vacuum and then vertically etched to leave the dielectric sidewall material 19S on the side wall of pillars 19B. The hard mask layer remains on top of the pillar during this etching phase. The dielectric sidewall material 19S prevents the sidewall of barrier layer in the pillar from being exposed to metallic redeposition during subsequent processing. The sleeve of dielectric material, thus formed, ends at the lower magnetic layer in a horizontal plane parallel to the surface of the wafer.

Figure 13:
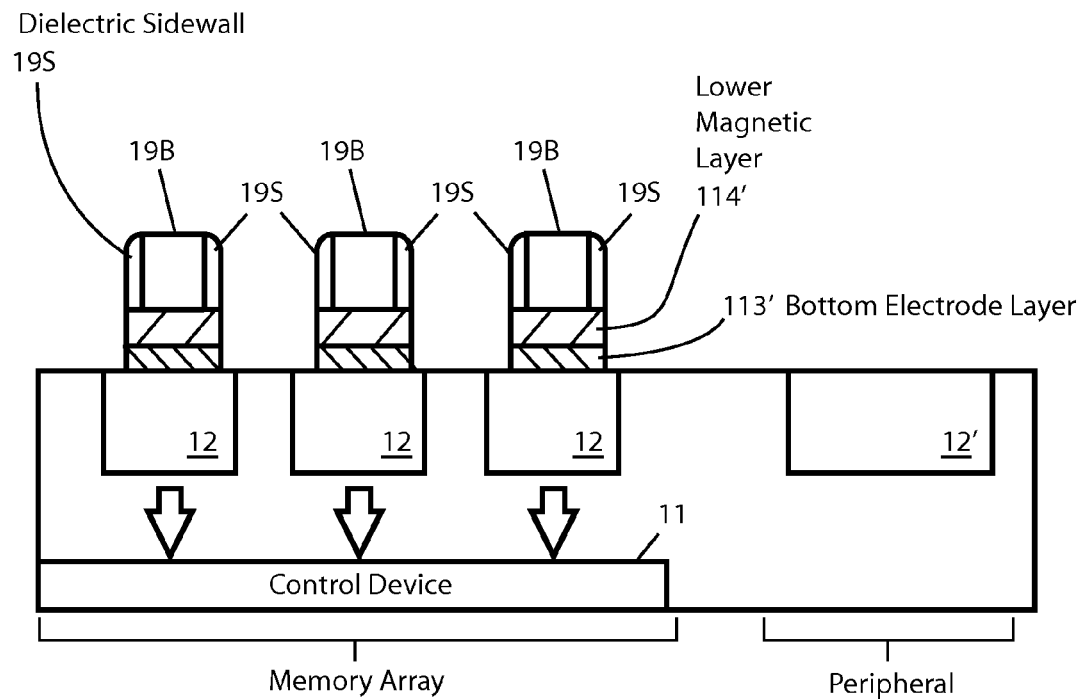
Figure 14:
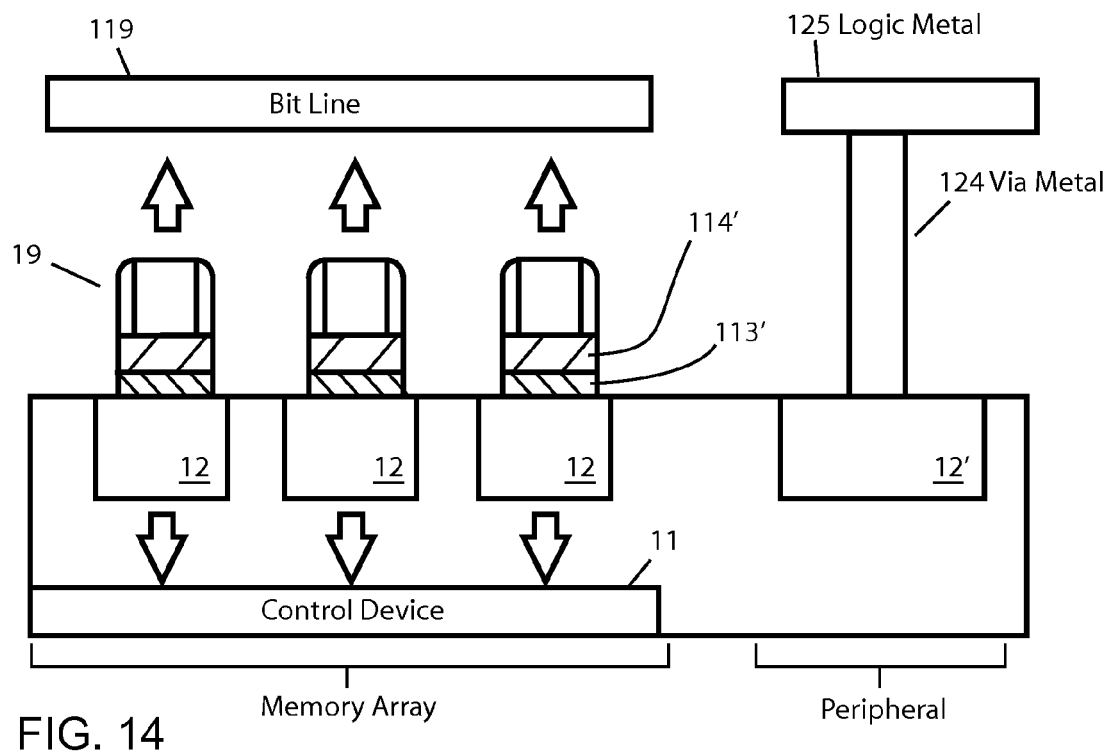

From the stage shown in FIG. 12, vertical etching is performed to remove the first or lower magnetic layer 114 and the bottom electrode layer 113 material between the pillars. The hard mask layer (not shown) on top of the pillars serves as the etching mask during this phase, but is essentially consumed in the process leaving the top electrode exposed on top of the pillar at the end of the process. The resulting stage is shown in FIG. 13, where the barrier layer remains protected with the dielectric sidewall 19S. The standard interconnect process follows as illustrated in FIG. 14.

Fourth Embodiment

Figure 15:
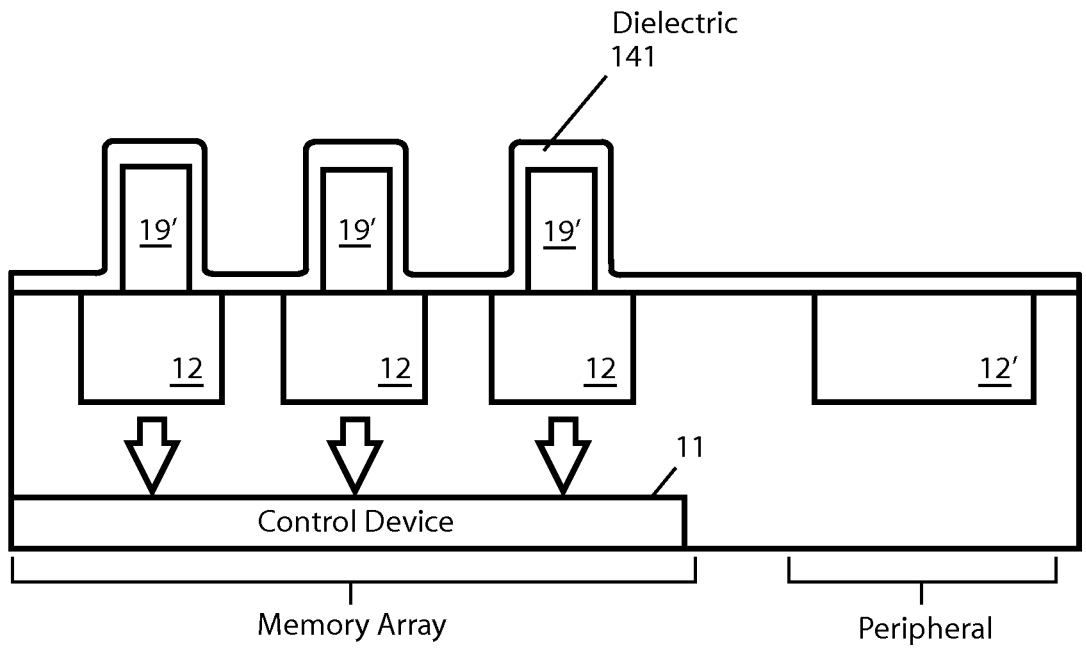
FIG. 15-FIG. 17 illustrate cross sectional views of selected process stages for the fourth embodiment of the invention.
Figure 16:
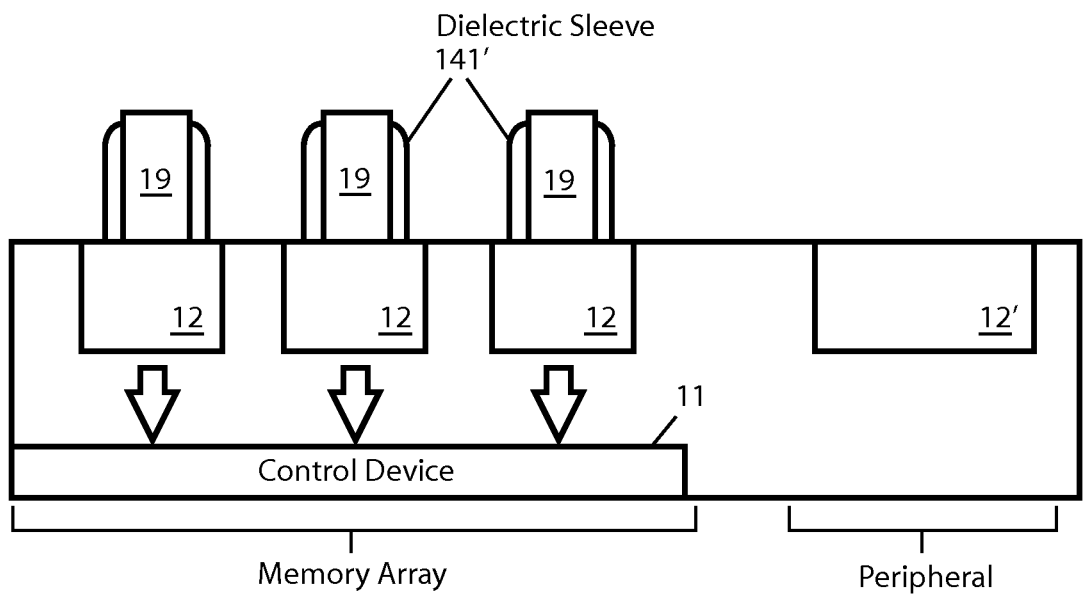

FIG. 15-FIG. 16 illustrate cross sectional views of process stages for the fourth embodiment. Redeposition and etching processes simultaneously take place on the pillar sidewall when the MTJ pillar is being etched. The net result depends primarily on the amount of redeposition source material that gets into the etching ambient. A potentially harmful amount of redeposition source material is supplied before the etching reaches the bottom electrode layer. The MTJ layers above the bottom electrode layer are quickly etched and become a source of redeposition material in the etching ambient. However, after reaching the bottom electrode layer, the etching rate is ten (10) times slower than for the previous MTJ stack materials. Therefore, during bottom electrode etching, the supply of new redeposition material is relatively reduced. During this phase sidewall etching becomes more dominant and the net result is that the sidewall is being cleaned. Similarly over-etching after the MTJ end point provides further cleaning of the sidewall. However, once the etching reaches the landing pads, another strong metallic redeposition material source is exposed to the ambient.

In this fourth embodiment the MTJ pillars 19' including a top hard mask layer (not shown) are deposited and patterned by using conventional lithography and dry etching as shown in FIG. 15. The bottom electrode layer 13X is shown enlarged for a single pillar 19' for clarity and is not drawn to scale. The layers and structures not shown are similar to those shown in previous embodiments. The etching for the pillars has been stopped prior to hitting the landing pad 12 surface. A thin layer 13X of bottom electrode material is intentionally left between the pillars to avoid having the landing pad surface exposed. The hard mask is expected to be etched away during this etching process but serves the purpose of reducing the total etching of the top electrode.

After the stage shown in FIG. 15, dielectric material 141, which is preferably oxygen free, is deposited and then vertically etched down to the landing pad 12 as shown in FIG. 16, which also removes the remaining electrode material between the pillars. Fluorocarbon, methanol, carbonyl/ammonia or their derivatives are used for the vertical etching. The thickness in the vertical direction of the deposited dielectric sleeve 141' is much thicker on the sidewall because of the slope than on flat or shallow slope areas such as the top of the pillars or the bottom area between the pillars.

Figure 17:
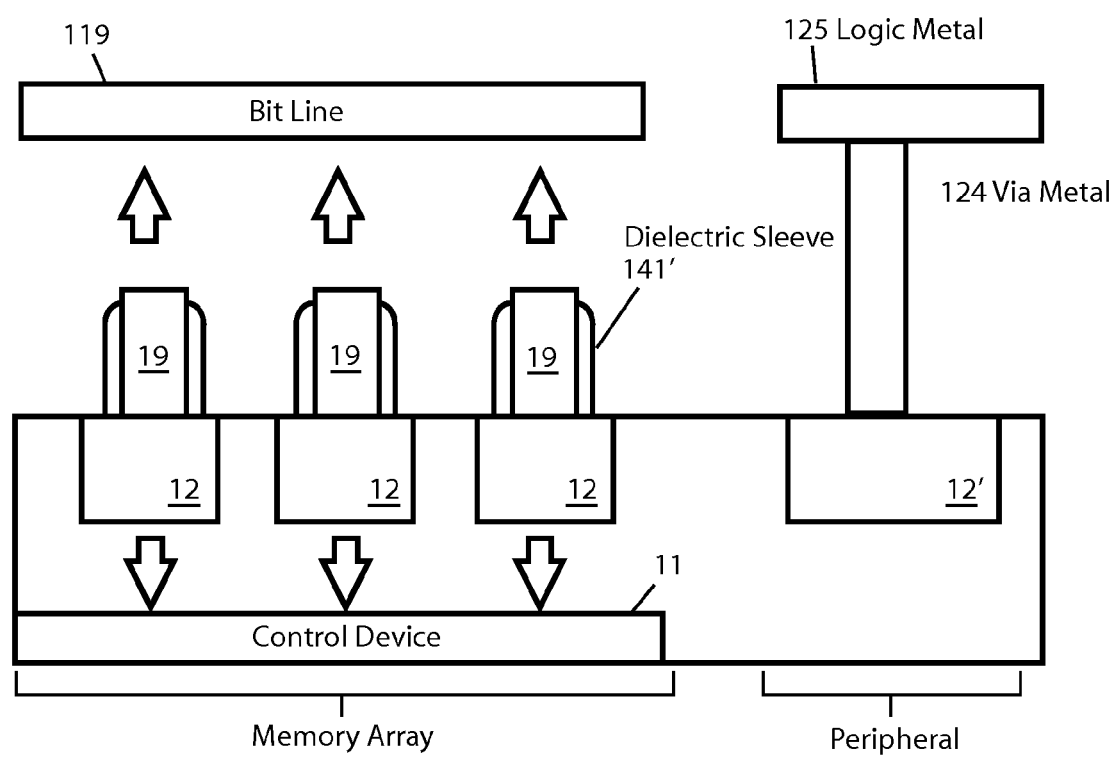

The end result of these process steps is that a protective sleeve of dielectric material 141' surrounds the sidewalls of the pillars 19' with the detail of the relationship between the protective sleeve of dielectric material 141' and the bottom electrode 13X' as shown in cross section in FIG. 16. As shown in FIG. 17 the sleeve of dielectric material 141' completely surrounds the barrier layer 14 as well as the upper and lower magnetic layers 14, 16. The sleeve of dielectric material 141' partially surrounds the top electrode 17 because the vertical etching process removes a fraction of the upper portion of the sleeve 141'. The sleeve of dielectric material 141' surrounds the upper portion of bottom electrode 13X' with a small ledge formed in the bottom electrode 13X' extending under the sleeve 141'. An alternative description would be that the sleeve 141' sits on a small ledge formed in the bottom electrode 13X' and the ledge separates the sleeve from the landing pad 12. In a top view the pillar 19' is generally elliptical or circular and the sleeve 141' conforms to the shape of the pillar.

The top hard mask has been etched away. The vertical etching process also removes the remaining bottom electrode material that was left in place when the pillars were initially etched as described above. The protective sidewall dielectric 141' sleeve is in place when the final remaining bottom electrode material is removed and the sources of deleterious redeposition metal again increase. The standard interconnect process then follows as illustrated in the previous embodiments.

The invention claimed is:

1. A method of fabricating memory cells comprising:
   patterning a set of landing pads for the memory cells on a wafer;
   depositing a dielectric film over the wafer;
   etching selected holes through the dielectric film using a mask having gaps positioned over the dielectric film above a selected central area of an upper surface of each landing pad, the etching leaving the selected central area of the upper surface of each landing pad exposed;
   depositing metal over the wafer and into the holes in the dielectric film to form metal studs in electrical contact with the upper surface of each landing pad; and
   patterning a multi-layered memory cell pillar including a bottom electrode over each metal stud so that the metal stub provides electrical connection between the bottom electrode and the landing pad under the metal stud.

2. The method of claim 1 wherein the gaps positioned over the dielectric film above a selected central area of an upper surface of each landing pad are smaller in horizontal area than the upper surface of the landing pad.

3. The method of claim 1 further comprising actions performed after depositing metal over the wafer and into the holes in the dielectric film and before patterning a multi-layered memory cell pillar, including:
   performing a first CMP process to planarize the wafer surface, the first CMP process leaving at least some metal studs having an upper surface recessed from an upper surface of dielectric material around the metal studs;
   depositing a touch-up metal layer over the wafer; and
   performing a second CMP process to remove the touch-up metal layer from the dielectric material around the metal studs while leaving residual touch-up metal on at least some of the metal studs metal studs to improve planarization.

4. The method of claim 1 wherein the memory cell pillars are oval-shaped in a top plan view and have a long axis orientation parallel to a direction of a bit line, the method further comprising forming an oval-shaped via above each memory cell pillar after patterning the memory cell pillars, filling the oval-shaped via with metal, then fabricating an interconnection to connect metal in the oval-shaped via to a bit line.

* * * * *